United States Patent [19]
Bovino et al.

[11] Patent Number: 5,153,442
[45] Date of Patent: Oct. 6, 1992

[54] HIGH POWER, SOLID STATE RF PULSE GENERATORS

[75] Inventors: Lawrence J. Bovino, Eatontown; Maurice Weiner, Ocean; Anderson H. Kim, Eatontown, all of N.J.

[73] Assignee: The United States of America as represented by the Secretary of the Army, Washington, D.C.

[21] Appl. No.: 637,384

[22] Filed: Jan. 3, 1991

Related U.S. Application Data

[63] Continuation of Ser. No. 374,122, Jun. 12, 1989, abandoned.

[51] Int. Cl.⁵ .............................................. G02B 27/00
[52] U.S. Cl. .................................. 250/551; 250/211 J
[58] Field of Search ............... 250/551, 213 A, 211 J, 250/227.12; 328/65, 67; 307/113, 115, 117, 246, 311

[56] References Cited

U.S. PATENT DOCUMENTS

| | | | |
|---|---|---|---|
| 3,555,301 | 1/1971 | Hansen | 328/67 |
| 3,558,919 | 1/1971 | Olk | 328/67 |
| 3,838,278 | 9/1974 | Duguay et al. | 250/227.12 |
| 4,695,733 | 9/1987 | Pesavento | 250/551 |
| 4,822,991 | 4/1989 | Riggs et al. | 250/211 J |
| 4,870,295 | 9/1989 | Rauscher | 250/213 A |
| 4,900,947 | 2/1990 | Weiner et al. | 250/551 |

OTHER PUBLICATIONS

"Optoelectronic Techniques for Microwave and Millimeter-Wave Applications", Lee et al.; IEEE MTT-S Digest pp. 178-181 1985.

*Primary Examiner*—David C. Nelms
*Attorney, Agent, or Firm*—Michael Zelenka; William H. Anderson

[57] ABSTRACT

A high power, solid state burst generator for producing RF pulses includes a plurality of transmission lines, such as coaxial cables, having one end connected across a load via a plurality of photoconductive switches, one for each line. The other end of the transmission lines are terminated in open ends and connected to a charging DC voltage. One set of lines is connected to a positive DC voltage +V while other set is connected to a negative DC voltage −V. A laser is coupled to one end of a plurality of fiber optic lines, each having a different length, for simultaneously launching switch pulses thereon. The other ends of the fiber optic lines are each coupled to a different one of the photoconductive switches for closing and opening the switches in a sequential fashion such that the lines are sequentially discharged through the load to generate a cyclic series of pulses.

9 Claims, 2 Drawing Sheets

HIGH POWER, SOLID STATE RF PULSE GENERATORS

The invention described herein may be manufactured, used, and licensed by or for the Government for governmental purposes without the payment to us of any royalty thereon.

This is a continuation of Ser. No. 314,122, filed Jun. 12, 1989, now abandoned.

BACKGROUND OF THE INVENTION

1. Field of the Invention

The present invention relates to radio frequency pulse generators, and more particularly to high power, solid state burst generators in the microwave region.

2. Description of the Prior Art

There are many applications in which it is useful to be able to generate short, high power (megawatt) bursts of radio frequency power. For example, radio frequency bursts are useful in high resolution radar, time domain meteorology, microwave generation, countermeasure devices, military weapons, and plasma research and diagnosis. Many conventional systems for generating radio frequency bursts have experienced serious problems because of the relatively high losses and other inefficiencies inherent in those systems. One type of prior art system in this class involves the direct DC to RF conversion at megawatt power levels. One such device, called the frozen wave generator (FWG), was specifically designed to avoid the many problems unique to the generation of very high peak power bursts by the direct conversion of DC to RF power. For instance, the FWG is a device that employs very fast switches and as such has made use of optoelectronic techniques to perform the switching functions. The recently developed photoconductive switches (PCS) are ideally suited to be used in the FWG. These switches are disclosed by L. Bovino, M. Weiner and T. Burke in "Optically Controlled, High Power, High Speed Semiconductor Switches", ELECTRO '87, Professional Program Record, Session 24, pp. 1-7, incorporated herein by reference. Also, incorporated herein by reference is a publication concerning the FWG by Chi H. Lee et al entitled "Optoelectronic Techniques for Microwave and Millimeter-Wave Applications", 1985 IEEE MTT-S International Microwave Symposium, pp. 178-181.

In order to make the FWG work effectively, certain critical switch characteristics must be achieved. First, the switch closing time (pulse rise time) must be significantly less than one half-cycle in order not to interfere with the FWG's characteristic frequency. In addition, the simultaneity of the switches should be very good; the overall switch jitter must be short, i.e. all switches must close within a short period. These criteria can be met by many low power switches at high frequency and several high power switches at low frequency. The bulk PCS is probably the only device that can meet the rise time and jitter requirements of a megawatt FWG at GHz frequencies. Further, in the FWG, switch conduction losses add making it difficult to construct a reasonably efficient FWG having a switch on-time that is long. Although a bulk PCS can be designed which will meet the above requirements, at the higher frequencies and longer burst durations, the requirement for fast rise time combined with long on-time (at low loss) becomes extremely difficult to meet. A high power PCS requires a relatively high power laser as a source. Also, the PCS is least lossy while the laser remains on, therefore, a fast-rising, long pulse width, high-power laser is the optimum source. Consequently, the design of the FWG is severely limited by the availability of a suitable laser to close the PCS. In addition, the preferred technique for closing the switches simultaneously is to use a single laser pulse to drive all the switches. Using this technique holds some switches closed for longer than is necessary, thus wasting laser energy. Again, the problem becomes more severe at longer burst lengths. As the laser is usually the least efficient component of the system, it would be advantageous to devise a periodic waveform generator which is not as wasteful as the FWG.

Therefore, although the FWG and other burst generators have, in general, served the purpose, they have not proved entirely satisfactory, having a number of deficiencies such as those described above. As such, those concerned with the development of RF burst generators have recognized the need for improvements therein. The present invention fulfills this need.

SUMMARY OF THE INVENTION

The general purpose of this invention is to provide a microwave burst generator which embraces all the advantages of similarly employed devices and possesses none of the aforedescribed disadvantages. To attain this, the present invention contemplates a unique transmission line and switching arrangement wherein large conduction losses and inefficiencies are avoided making it possible to construct generators that produce higher powers at higher frequencies for longer periods.

The exact nature of this invention, as well as other objects and advantages thereof, will be readily apparent from consideration of the following description relating to the annexed drawing.

BRIEF DESCRIPTION OF THE PREFERRED EMBODIMENT

DETAILED DESCRIPTION OF THE PREFERRED EMBODIMENT

Figure 1:
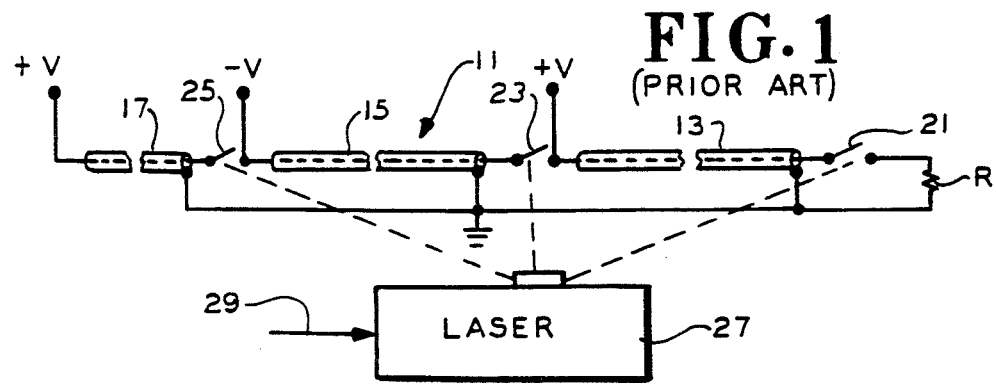
FIG. 1 shows a schematic diagram of a prior art system.

Referring now to the drawings, wherein like reference characters designate like or corresponding parts throughout the several views, there is shown in FIG. 1 (which illustrates a prior art device) a frozen wave generator (FWG) 11 having three transmission lines, illustrated here as coaxial lines 13, 15 and 17. Coaxial line 13 has its inner conductor connected at one end to one side of switch 21, and at the other end to a positive DC voltage +V and one side of switch 23. The other side of switch 21 is connected to one side of the grounded load R. The inner conductor of coaxial line 15 is connected at one end to the other side of switch 23, and at the other end to a DC voltage −V and one side of switch 25. The other side of switch 25 is connected to one end of the center conductor of coaxial line 17. A DC voltage +V is connected to the other end of the center conductor of coaxial line 17. The outer conductors of coaxial lines 13, 15 and 17 are grounded in common with the grounded side of load R. The length of the coaxial lines 13 and 15 are equal and referred to here as having length L. Coaxial line 17 is half the length of lines 13 and 15, having the length L/2. It is understood that the lines 13, 15 and 17 may be formed from any suitable type of delay line, primarily dictated by frequency, other than coaxial lines as shown here for illustration only. The switches 21, 23 and 25 are suitably designed bulk photoconductive switches controlled by a laser beam from laser 27 having an input line 29 for firing laser 27. The load R is matched to the common characteristic impedance of the coaxial lines 13, 15 and 17. As such, the transmission times for lines 13 and 15 are each equal, say t, while the transmission time for line 17 is half the transmission times of lines 13 and 15, i.e. t/2.

Figure 2:
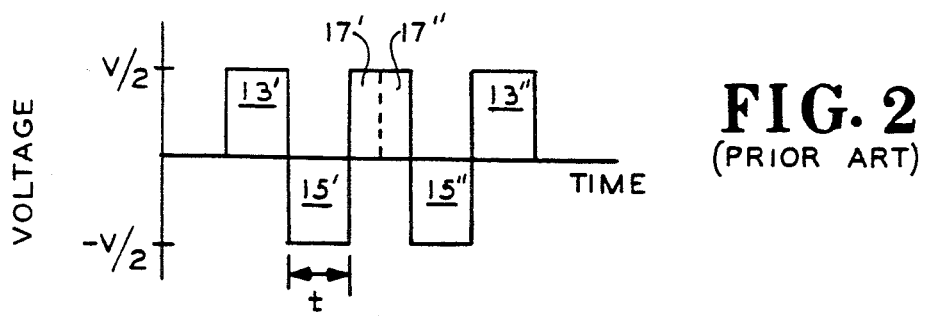
FIGS. 2 and 3 show waveforms useful in understanding the device of FIG. 1.

When the laser 27 is fired, via input terminal 29, the laser beam causes switches 21, 23 and 25 to close simultaneously. As such, waves begin traveling in opposite directions in the charged lines 13, 15 and 17. Assuming ideal switches 21, 22 and 25 and lossless transmission lines 13, 15 and 17, the voltage across load R is as shown in FIG. 2 wherein the contribution from each line 13, 15 and 17 to the waveform is identified. Because the left end of line 17 is open, wave reflections will occur here for those waves that originally traveled to the left, i.e. away from the load R. The contributions to the waveform in FIG. 2 for the direct waves are identified by the numerals 13', 15' and 17', and for the reflected waves as 13", 15" and 17".

The three transmission lines 13, 15 and 17 are charged separately to the voltages +V, −V, and +V. Each transmission line 13, 15 and 17 can be considered to have two standing waves stored within it, having amplitudes equal to half of the charging voltages +V and −V. Once the three switches 21, 23 and 25 are closed instantaneously with zero resistance, those standing waves (or frozen waves) start to travel in two directions. Therefore, three traveling waves move toward the output end with load R. And another three traveling waves will follow the previous waves due to the total reflection from the open termination end to the left of line 17. Because the length of the line 17 is half of the length of lines 13 and 15, a two and one half cycles of pulses will appear at load R, having a pulse width t and amplitude V/2 as shown in FIG. 2. As pointed out above, several considerations for switches 21, 23 and 25 must be satisfied to make the FWG 11 operate properly to generate the waveforms illustrated in FIG. 2.

First, the closing time (rise time) for switches 21, 23 and 25 must be significantly less than one-half cycle (t/2) in order not to interfere with the FWG's characteristic frequency. For example, if t=5 nanoseconds (ns), corresponding to an FWG frequency of 100 MHz, then the rise time for switches 21, 23 and 25 should be less than 0.5 ns. In addition, the simultaneity of the switches 21, 23 and 25 should be very good; the overall switch jitter must be less than 0.5 ns, i.e. all switches 21, 23 and 25 must close within 0.5 ns. As stated earlier, the bulk PCS is perhaps the only device that, in a practical sense, can meet the rise time and jitter requirements of a megawatt FWG at GHz frequencies.

Figure 3:
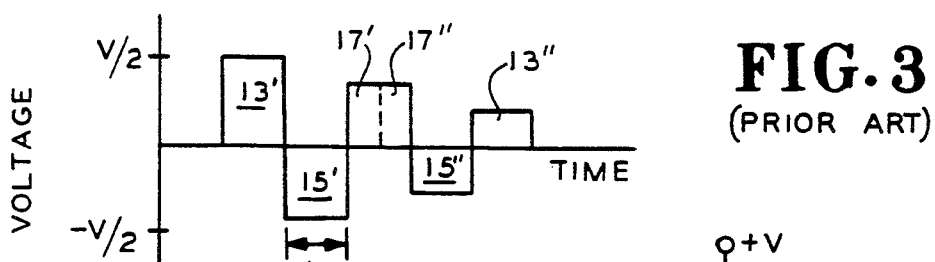

FIG. 3 shows the waveform for the FIG. 1 device assuming that the switches 21, 23 and 25 are lossy. The waveform droops because each successive half cycle must travel through one more of the switches 21, 23 and 25 than the previous half cycle. This droop, of course, will be further exaggerated by similar compound line losses from lines 13, 15 and 17. It is also noted that switch 21 must remain closed for the entire burst duration (5t), switch 23 must remain closed for 4t and switch 25 must remain closed for 3t. Consequently, since it is essential to minimize the switch conduction losses in order to construct a reasonably efficient FWG, for the example given above, switch 21 must close in 0.5 ns, remain closed for 25 ns, and have a resistive loss of no more than Z/100 for its entire conduction time, where Z is the characteristic line impedance of lines 13, 15 and 17.

The switches 21, 23 and 25 can be designed from a bulk PCS which will meet the above requirements. However, at higher frequency and longer burst duration, the requirement for fast-rise time (t/10) combined with long on-time (at low loss) becomes extremely difficult to meet. A high power PCS requires that the laser 27 be a relatively high power laser. Also, the PCS is least lossy while the laser 27 remains on, therefore a fast-rising, long pulse width, high-power laser 27 is the optimum source. The design of the FWG 11 is, therefore, severely limited by the availability of a suitable laser 27 to close the switches 21, 23 and 25. In addition, the preferred technique for closing the switches 21, 23 and 25 simultaneously is to use a single pulse from laser 27 to drive all the switches 21, 23 and 25. Using this technique holds switches 23 and 25 closed for longer than is necessary, thus wasting laser energy. Again, the problem becomes more severe at longer burst lengths. As the laser 27 is normally the least efficient component of the system, it is advantageous to devise a periodic waveform generator which is not as wasteful as the frozen wave generator 11.

Figure 4:
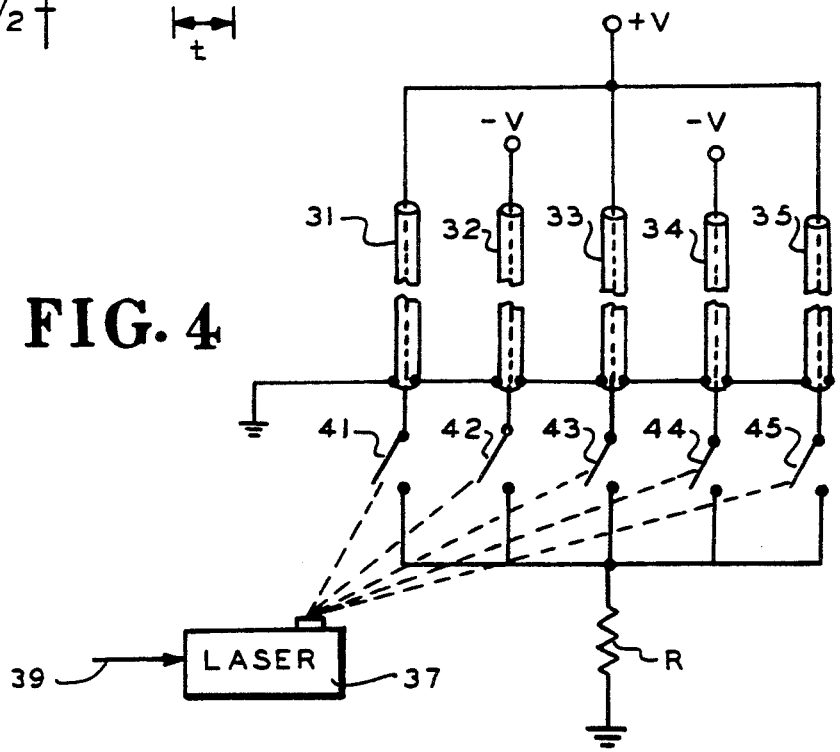
FIG. 4 shows a schematic diagram of the preferred embodiment.

The preferred embodiment in FIG. 4 will generate the same waveform as the FWG 11 of FIG. 1 but with greater efficiency and fewer losses. The FIG. 4 device includes five transmission lines 31-35 of equal length, shown here as coaxial lines. A DC voltage +V is connected to one end of the center conductor of lines 31, 33 and 35. A DC voltage −V is connected to one end of the center conductors of lines 32 and 34. The other ends of the center conductors of lines 31-35 are connected to one side of switches 41-45, respectively. A load R is connected between ground and the other side of switches 41-45. The outer conductors of lines 31-35 are each grounded. It is assumed, as in the FIG. 1 example, that the lines 31-35 may be configured from any suitable transmission line for the frequency involved. The load R represents the utilization device and has an impedence that matches the characteristic impedance of lines 31-35. The transmission lines 31-35 have equal lengths and have a transit time of t/2. Where they are connected to voltages +V and −V, the transmission lines 31-35 each have open ends wherein wave reflections occur. The laser 37 having trigger input 39 is designed to switch the photoconductive switches 41-45 sequentially rather than simultaneously as in the FIG. 1 device.

In the FIG. 4 device the transmission lines 31-35 are charged to the voltages +V and −V. Again, the lines 31-35 can be considered to have two standing waves stored within it, having amplitude equal to half of the charging voltages +V and −V. Once a switch, say switch 41, is switched to near zero resistance, the standing waves start to travel in two directions. Therefore, on line 31 one wave travels toward load R while another travels away from load R toward the open end where it is reflected back toward load R. After the reflected portion of the wave in line 31 reaches load R, switch 41 is allowed to open and switch 42 is closed. This process is now repeated in line 32. The same process is continued sequentially through switches 43, 44 and 45, thereby generating the waveform shown in FIG. 5.

Figure 5:
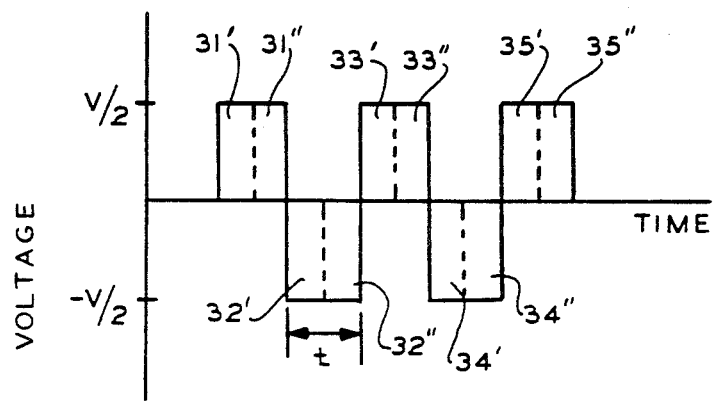
FIG. 5 shows a waveform useful in understanding the circuit of FIG. 4.

It is noted that in this case the amplitude of the waveform (FIG. 5) does not progressively decrease as with the FWG 11 (FIG. 3) because each pulse, i.e. each half cycle of the periodic waveform in FIG. 5, experiences identical loss. Assuming switches 41-45 are identical to switches 21, 23 and 25 (FIG. 1), the power dissipated in the switches 41-45 is reduced by a factor of three. There is further increase in efficiency as the number of cycles is increased. For example, to generate nine half cycles, the power loss in the switches of FWG 11 is five times that in the switches 41-45.

The optical signal from laser 37 is also used more efficiently in the present invention of FIG. 4. The laser energy required to generate the desired waveform (FIG. 5) can be expressed in terms of the total time that the switches 41-45 are closed. Each switch 41-45 need only be closed for a time t, therefore the total time for all five switches 41-45 is 5t. For the three switches 21, 23 and 25 in the FWG 11 to generate the same five half cycles, the switches 21, 23 and 25 must remain closed for a minimum total time of 12t. Again the present invention (FIG. 4) becomes comparatively more efficient as the burst length increases.

Figure 6:
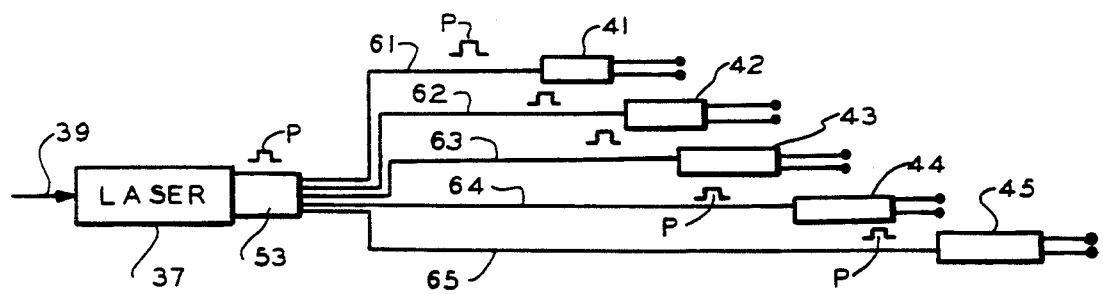
FIG. 6 shows a switching circuit in schematic to be used in combination with the device of FIG. 4.

FIG. 6 shows a laser pulse delivery system 51 that may be used to sequence the switches 41-45 using a single laser pulse P. The laser 37 has an output coupler 53 for coupling an output laser pulse P onto an optical fiber bundle having fibers or fiber bundels 61-65 that in turn are coupled to switches 41-45, respectively. The fibers 61-65 are each of a different length such that the laser pulses P transmitted thereon will arrive sequently at switches 41-45. In other words, each fiber, say fiber 62, must provide a propagation delay which is exactly t seconds longer than the previous fiber, say fiber 61.

A further requirement of the switches 41-45 in the present invention is that only one switch at a time may conduct. This means that immediately after any line, say line 33, is discharged, its switch must recover to a non-conducting state so as not to affect the discharge of the next line 34. The recovery time of a PCS is directly related to the carrier lifetime of the switch material. This is especially true under the condition of zero voltage and current as is the case for any of the switches 41-45 immediately after its corresponding line 31-35 has discharged. Semi-insulating materials such as Cr:GaAs and Fe:InP have carrier lifetimes from one ns down to a few picoseconds and are good photoconductors. Therefore, a PCS is ideally suited for use in the present invention.

Figure 7:
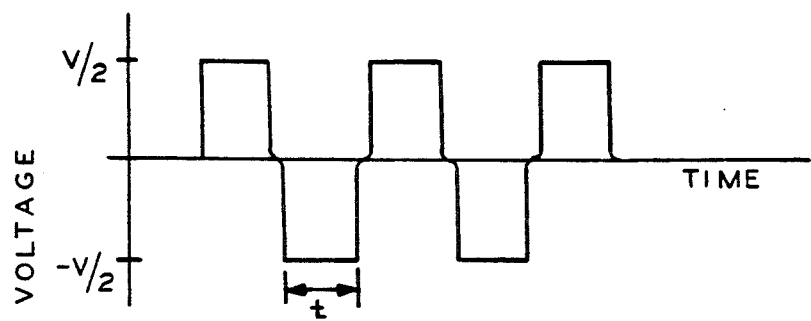
FIG. 7 shows a waveform similar to that of FIG. 5 useful in understanding a modified version of the invention.

In the event that the recovery of a switch 41-45 cannot be made sufficiently fast, additional zero current, zero voltage time for recovery can be provided by slightly increasing the delays in each of the fibers 61-65 so that no two switches 41-45 are illuminated simultaneously. The resulting (idealized) waveform for this situation is shown in FIG. 7.

One other advantage of the present invention is that lower voltage switches 41-45 can be used to generate the same amplitude waveform as the FWG 11. It can be seen from FIG. 1 that switches 23 and 25 must have a voltage blocking capacity of twice V because one end of each of the switches 23 and 25 is charged to $+V$ while the other end is at $-V$. For the present invention, the maximum voltage that a switch, say switch 33, will see is 1.5 times V when the line, say line 43, is charged to $+V$ and the load R voltage is $-V/2$. This is of particular interest when bulk PCS's are used as the switches 41-45. The voltage hold-off of a bulk PCS is directly proportional to its length. At the same time, for a given optical input, the on-state resistance of the PCS is directly proportional to the square of its length. Reducing the switch voltage, therefore, allows for reduction of the length of switches 41-45 which in turn allows for reduction of either the optical input or the switch conduction loss.

The only price, then, of the present invention is an increased number of components as compared to the FWG 11 designed to produce the same signal. Quantitatively, an n-section FWG 11 must be replaced by a (2n-1)-section device of the present invention.

Obviously, many modifications and variations of the present invention are possible in the light of the above teachings. For example, the principles of the present invention may be employed to generate waveforms of a variety of shapes. By having the DC source voltages, shown in FIG. 4 with equal absolute values V, of different values, a waveform having pulses of different amplitudes may be generated. Additionally, the values of voltages $+V$ and $-V$ may be changed or modulated as a series of such waveforms are generated. Further, the pulse periods of the waveform can be different for different pulses by having different transmission line lengths for lines 31-35. Of course, in that case it would also be necessary for the laser 37 to properly pulse the switches 41-45. The generation of a wave train having pulses of different and/or varying magnitude and periods would be of particular importance in coding or modulating signals for use in radar and communications. It is therefore to be understood, that within the scope of the appended claims, the invention may be practiced otherwise than as specifically described.

What is claimed is:

1. A high power, solid state burst generator for producing RF pulses comprising:

a first and second set of transmission lines each transmission line having first and second ends, the sets of transmission lines being aligned in series such that the first end of the first set of transmission lines alternates with the first end of the second set of transmission lines;

a plurality of photoconductive switches, each photoconductive switch being connected to the first end of each transmission line;

a load connected in series to each of the photoconductive switches on an opposite side of the photoconductive switches from the transmission lines;

a positive voltage source connected in series to the second ends of the first set of transmission lines for positively charging the first set of transmission lines;

a negative voltage source connected to the second ends of the second set of transmission lines for negatively charging the second set of transmission lines;

a laser source coupled to each photoconductive switch for sequentially closing and opening a different one of the photoconductive switches and for discharging in sequence the transmission lines alternatively between the first and second sets of the transmission lines.

2. The generator of claim 1 wherein said positive voltage source is a positive DC voltage and said negative voltage source is a negative DC voltage and said voltages have equal magnitude.

3. The generator of claim 2 wherein the laser source is coupled to the photoconductive switches by a plurality of optical fibers having first and second ends with the first ends coupled to said laser source and the second ends each operatively coupled to a different one of the photoconductive switches.

4. A generator according to claim 3 wherein the optical fibers are of different lengths such that a single pulse from the laser source will sequentially arrive at the photoconductive switches.

5. The generator of claim 4 wherein said optical fibers are of a length such that no two of the photoconductive switches are closed at the same time.

6. The generator of claim 1 wherein each photoconductive switch provides an overall switch jitter of less than 0.5 nanoseconds.

7. The generator of claim 1 wherein the photoconductive switches are fabricated of gallium arsenide doped with chromium.

8. The generator of claim 1 wherein the photoconductive switches are fabricated of indium phosphide doped with iron.

9. The generator of claim 1 wherein the transmission lines have equal propagation times.

* * * * *